(12) United States Patent
Marumo

(10) Patent No.: US 6,800,803 B1
(45) Date of Patent: Oct. 5, 2004

(54) SEMICONDUCTOR MANUFACTURING METHOD AND APPARATUS

(75) Inventor: Mitsuji Marumo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/551,910

(22) Filed: Apr. 19, 2000

(30) Foreign Application Priority Data

Apr. 21, 1999 (JP) ............................................ 11-113533

(51) Int. Cl.[7] .............................................. H05K 9/00
(52) U.S. Cl. .......................... 174/35 GC; 174/35 MS; 174/35 R; 174/66; 174/101; 361/816; 361/818; 414/222.01; 414/222.13; 414/939
(58) Field of Search ........................ 174/35 GC, 35 MS, 174/35 R, 66, 101; 361/816, 818; 414/222.01, 222.13, 939

(56) References Cited

U.S. PATENT DOCUMENTS

| | | | | |
|---|---|---|---|---|
| 4,978,812 A | * | 12/1990 | Akeyoshi et al. | 174/35 MS |
| 5,445,675 A | * | 8/1995 | Kubodera et al. | 118/719 |
| 5,583,750 A | * | 12/1996 | Nakata et al. | 361/816 |
| 5,972,116 A | * | 10/1999 | Takagi | 118/719 |
| 6,236,366 B1 | * | 5/2001 | Yamamoto et al. | 343/700 MS |

* cited by examiner

Primary Examiner—Anthony Dinkins
Assistant Examiner—Jinhee Lee
(74) Attorney, Agent, or Firm—Fitzpatrick, Cella, Harper & Scinto

(57) ABSTRACT

A semiconductor manufacturing apparatus includes a leakage preventing device for preventing outward leakage of electromagnetic waves through an opening defined when a pod having a substrate accommodated therein is mounted on the semiconductor manufacturing apparatus. The leakage preventing device includes at least one electromagnetic wave shielding plate and is provided at the semiconductor manufacturing apparatus side. The apparatus also includes a first electromagnetic wave shielding plate, which is openable and closable so that an opening defined when a carrier in the standard mechanical interface pod is moved downwardly is closed by the plate, and a second electromagnetic wave shielding plate, which has an openable and closable slit provided between an indexer for moving the carrier in the standard mechanical interface pod downwardly and a conveyance robot for conveying the substrate.

31 Claims, 7 Drawing Sheets

SEMICONDUCTOR MANUFACTURING METHOD AND APPARATUS

FIELD OF THE INVENTION AND RELATED ART

This invention relates to a semiconductor manufacturing method and apparatus with a conveying system, for automatically conveying a substrate such as a wafer or a glass plate (hereinafter, "wafer") or a photomask or a reticle, or a pod for accommodating such a substrate, for performing an exposure process, a washing process and an inspection process, for example.

Referring now to FIG. 8, wafer conveyance in a semiconductor manufacturing apparatus (here, an exposure apparatus) will be described.

In an exposure apparatus such as shown in FIG. 8, plural substrates 4 are accommodated in a carrier 2, and they are sequentially taken out of the carrier by a conveying robot 1. Each substrate is then loaded onto a mechanical prealignment station 39, and wafer alignment is performed in relation to the position of an orientation flat 4a defined at an edge of each substrate 4. In this positioning process, first the substrate 4 is held by a mechanical alignment chuck 8, and then, while rotating the substrate 4 by a mechanical prealignment θ stage 7, the position of the orientation flat 4a of the substrate 4 is detected by using a mechanical prealignment optical system (9, 10 and 11). Then, the position of the orientation flat 4a as well as the amount of eccentricity of the substrate 4 are calculated, and finally, the substrate is positioned into a predetermined position, by use of a mechanical prealignment X stage 5, a mechanical prealignment Y stage 6 and the prealignment θ stage 7. Thereafter, the substrate 4 is gripped by a substrate holding means (hand), not shown, and it is moved onto a wafer chuck 12. Subsequently, the substrate 4 being chucked by the wafer chuck 12 is moved stepwise by means of a processing station 13, and an exposure process is performed thereto through an optical system, not shown. After completion of the exposure process, the substrate 4 is unloaded from the wafer chuck 12 by the conveyance robot 1, and it is stored into a carrier 3.

Conventionally, carriers each for accommodating plural substrates therein are an open type carrier (open type cassette) wherein the carrier is loaded into a semiconductor manufacturing apparatus without being kept in a clean box and wherein the carrier has no container for isolating each substrate from an outside ambience. Such an open type cassette may not cause particular inconveniences as long as the entire space inside a clean room is kept as an environment containing only a few particles. However, if there are many particles contained, it causes a problem that particles are adhered to the substrate.

As a matter of course, it takes much cost to keep the entire space of a clean room as an environment having a few particles, for particle deposition prevention.

In consideration of it, a method for keeping each substrate in a clean state regardless of the presence of some particles in a clean room, has been proposed. This method is called a mini-environment system. According to this system, a carrier as a whole, containing substrates therein, is covered by a container. When the carrier is loaded into a semiconductor manufacturing apparatus, a door of the container is opened such that the inside of the container and the internal structure of the semiconductor manufacturing apparatus are coupled with each other through the opening of the container. With this arrangement, even if there are some particles in the clean room, particles are not deposited on a substrate being kept isolated by the container.

As regards this mini-environment system, there are two types proposed. Theses two types are categorized in terms of the door opening/closing direction. The first one is a type wherein a front door is opened/closed along a lateral direction, and this type of cassette is called a front open unified pod (FOUP) being standardized with respect to a 300 mm substrate in accordance with the SEMI standard. The second type is one called a bottom opening type wherein a bottom door is opened downwardly. A standard mechanical interface pod (SMIFPOD) is an example of this type.

On the other hand, semiconductor manufacturing apparatuses should have measures for prevention of outward leakage of electromagnetic waves. According to regulations for electromagnetic wave leakage prevention, each semiconductor manufacturing apparatus must satisfy a limitation for an electromagnetic wave interference characteristic (electromagnetic radiation interference). An example of such regulations is found in the European harmful electromagnetic wave restrictions (CISPR Pub. 11).

Generally, a main assembly of a semiconductor manufacturing apparatus is housed in a metal chamber, to prevent outward leakage of electromagnetic waves. However, a resin such as an acrylic resin is used in a portion through which the inside of the semiconductor manufacturing apparatus is to be observed. In consideration of possible leakage of electromagnetic waves therethrough, conventionally, a metal mesh is mounted thereat to shield the electromagnetic waves. Since the mesh metal member does not shield electromagnetic waves if it is not grounded, usually the metal member is kept electrically communicated with the chamber so that it is grounded.

When a mini-environment type pod such as a FOUP or SMIFPOD as described above is used in a semiconductor manufacturing apparatus, there arise inconveniences such as follows.

Since, in conventional semiconductor manufacturing apparatuses, an open type cassette is loaded into the apparatus when the same is used, the provision of a function for electromagnetic wave leakage prevention only at the semiconductor manufacturing apparatus itself is sufficient. According to a pod of a FOUP or SMIFPOD type, on the other hand, a pod is mounted outside the semiconductor manufacturing apparatus. Also, a door at the front or bottom of the pod is opened in response to the opening of a door at the semiconductor manufacturing apparatus side, and a substrate kept in the pod is taken out. Usually, the front or bottom door of the pod and the door at the semiconductor manufacturing apparatus are held open during the operation of the semiconductor manufacturing apparatus. Thus, the container of the pod just serves as a portion of an outside wall of the semiconductor manufacturing apparatus. As a result, even if a metal mesh member is used in the semiconductor manufacturing apparatus for prevention of electromagnetic wave leakage, there is a possibility of leakage of electromagnetic waves through the container unless the container is equipped with a function for electromagnetic wave leakage prevention.

SUMMARY OF THE INVENTION

It is an object of the present invention to provide a semiconductor manufacturing apparatus having a function for preventing outward leakage of electromagnetic waves through an opening.

It is another object of the present invention to provide a pod mounting method effective to prevent outward leakage of electromagnetic waves.

In accordance with an aspect of the present invention, there is provided a semiconductor manufacturing apparatus, characterized by leakage preventing means for preventing outward leakage of electromagnetic waves through an opening defined when a pod having a substrate accommodated therein is mounted on the semiconductor manufacturing apparatus, wherein said leakage preventing means is provided at the semiconductor manufacturing apparatus side.

In one preferred form of this aspect of the present invention, said leakage preventing means includes at least one electromagnetic wave shielding plate provided at the semiconductor manufacturing apparatus side. The pod may be a mini-environment type pod. The pod may be one of a front-open unified type pod and a standard mechanical interface pod. The at least one electromagnetic wave shielding plate may be arranged to surround the pod as the same is mounted. A first electromagnetic wave shielding plate may be openable and closable so that an opening defined when a carrier in the standard mechanical interface pod is moved downwardly is closed by said plate. There may be a second electromagnetic wave shielding plate in addition to the first electromagnetic wave shielding plate, said second electromagnetic wave shielding plate having an openable and closable slit and being provided between an indexer for moving the carrier in the standard mechanical interface pod downwardly and a conveyance robot for conveying the substrate.

The apparatus may further comprise an electromagnetic wave shielding member provided on at least one of an inside wall face and an outside wall face of said electromagnetic wave shielding plate, or inside said electromagnetic wave shielding plate. The electromagnetic wave shielding member may be provided at a surface of said electromagnetic wave shielding plate, which surface is engageable with a chamber for surrounding a main assembly of said semiconductor manufacturing apparatus when said electromagnetic wave shielding plate is closed.

The electromagnetic wave shielding member may comprise a mesh-like metal. The electromagnetic wave shielding member may comprise a metal coating. The leakage prevention by said leakage preventing means may be arranged to provide a limit value not greater than 100 dB ($\mu$V) with respect to a frequency range of 9 KHz to 400 GHz. The electromagnetic wave shielding plate may be grounded through the chamber. The semiconductor manufacturing apparatus may be an exposure apparatus.

In accordance with another aspect of the present invention, there is provided a pod mounting method, characterized by leakage prevention for preventing outward leakage of electromagnetic waves through an opening defined when a pod having a substrate accommodated therein is mounted on a semiconductor manufacturing apparatus, wherein the leakage prevention is accomplished at the semiconductor manufacturing apparatus side.

In accordance with a further aspect of the present invention, there is provided a semiconductor device manufacturing method, including a process for producing a semiconductor device by use of a semiconductor manufacturing apparatus as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.
[First Embodiment]

Figure 1:
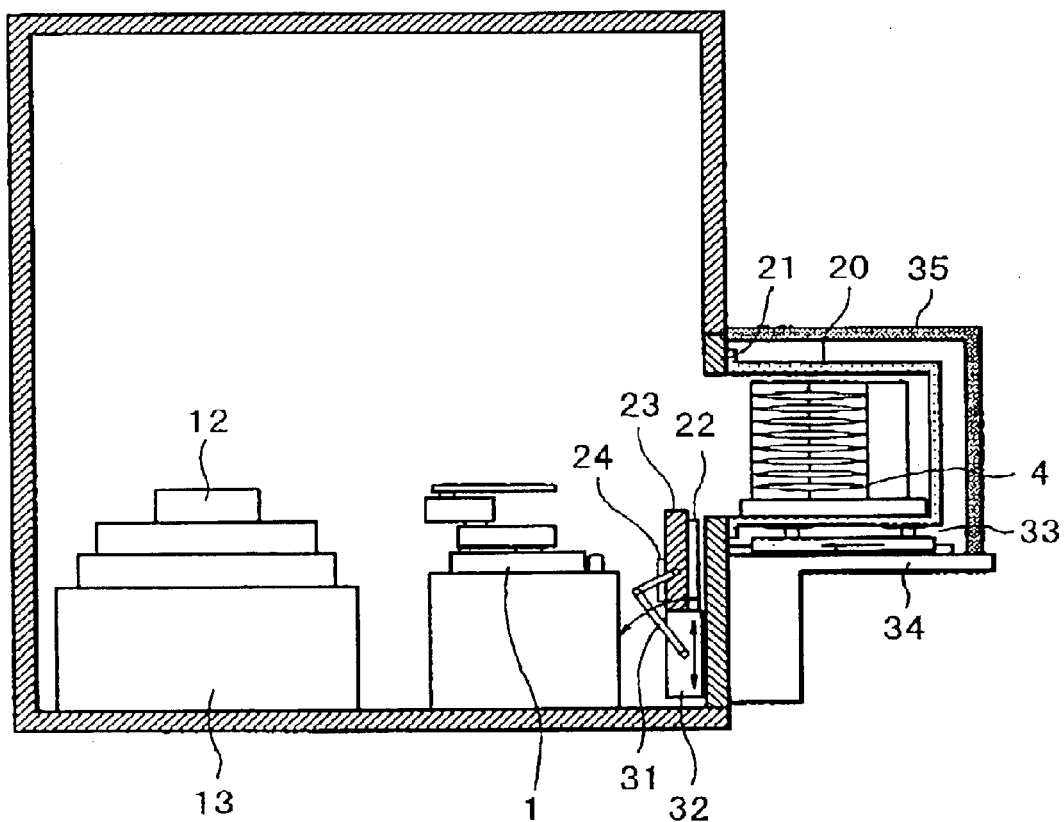
FIG. 1 is a schematic view of a first embodiment of the present invention.
Figure 4:
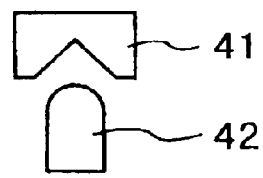
FIG. 4 is a schematic view of a V-shaped groove and a pin of a kinematic coupling.
Figure 5:
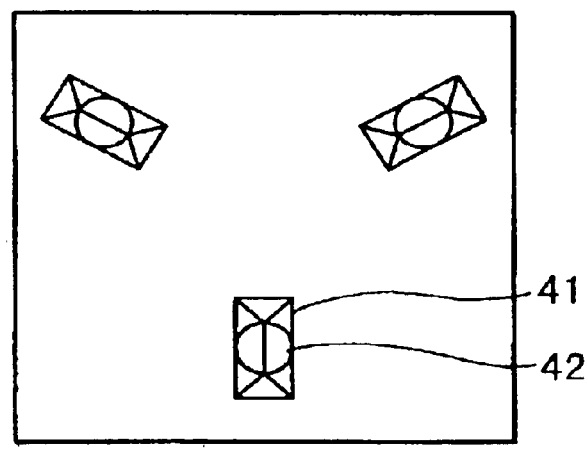
FIG. 5 is a schematic view of engagement between V-shaped grooves and pins at three locations, in kinematic coupling.

A first embodiment of the present invention will be described. As shown in FIG. 1, there is an electromagnetic wave shielding plate 35. After the plate 35 is opened by an opening/closing mechanism, not shown, a pod (FOUP) 20 is placed on a loading port 34 by means of an operator's hands (hereinafter, PGV (Physical Guided Vehicle)) or an automatic conveyance robot (hereinafter, AGV (Automatic Guided Vehicle)). Here, the positioning of the pod (FOUP) 20 is performed by means of a kinematic coupling 33. As regards the positioning, accurate positioning is accomplished by engagement between V-shaped grooves 41 (FIGS. 4 and 5) at three locations on the FOUP 20 side and pins 42 (FIGS. 4 and 5) at three locations on the loading port 34 side. FIG. 5 illustrates the state of engagement between the V-shaped grooves 41 and the pins 42.

After the positioning is accomplished, as shown in FIG. 1, the electromagnetic wave shielding plate 35 is closed. Then, the pod 20 is moved to the apparatus side and it is pressed against an opener flange 21.

After this, a front door 22 of the pod 20 is opened by releasing a lock (not shown) by means of a door lock releasing mechanism 24 which is provided on a FOUP opening/closing door 23.

Further, after this, while the pod door 22 is kept in intimate contact with the FOUP opening/closing door 23, the pod door is moved downwardly by means of a swingable arm 31 and a door elevating mechanism 32. As a result of this operation, substrates 4, which are accommodated in the pod 20, can be conveyed to a major assembly of the semiconductor manufacturing apparatus.

Here, if there is no electromagnetic wave shielding plate 35, since the container of the pod 20 serves as a portion of an outside wall of the semiconductor manufacturing apparatus, unless the container itself is provided with a function for electromagnetic wave leakage prevention, there occurs continuous leakage of electromagnetic waves during the operation of the semiconductor manufacturing apparatus. In this embodiment, even if the pod 20 is not equipped with an electromagnetic wave leakage preventing function, leakage of electromagnetic waves from the container of the pod 20 can be suppressed by the electromagnetic wave shielding plate 35, to a level not greater than a predetermined value.

Thereafter, a substrate 4 is conveyed onto a wafer chuck 12 mounted on the processing station 13, by means of the conveyance robot 1. Then, the substrate is exposed through an optical system (not shown), and again it is conveyed by the conveyance robot 1 and is collected into the pod 20.

Figure 2:
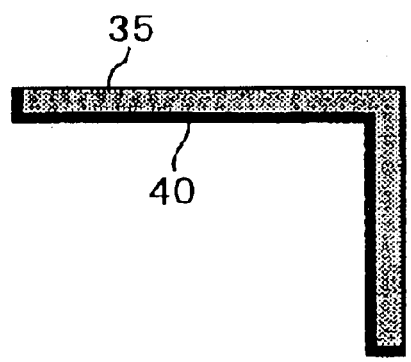
FIG. 2 is a sectional view of an electromagnetic wave shielding plate having a mesh-like metal provided at an inside wall thereof.

The electromagnetic wave shielding plate 35 of this embodiment will be described in detail. FIG. 2 is a sectional view of the electromagnetic wave shielding plate 35. The electromagnetic wave shielding plate 35 is made of a resin. There is a mesh-like metal 40 which is formed on the inside wall face of the electromagnetic wave shielding plate 35, at a predetermined pitch. The mesh metal 40 is illustrated by a thick line in the drawing. As regards the pitch of the mesh, a better result is attainable with a smaller pitch. For a frequency range of 9 KHz to 400 GHz, it may desirably be set to accomplish 100 dB ($\mu$V) or less.

The inside wall mesh metal 40 and the resin are made coplanar, so that the metal is not protruded from the surface. Also, the mesh-like metal 40 extends to the surface of the electromagnetic wave shielding plate 35, which surface is contactable with the chamber. Thus, when the electromagnetic wave shielding plage 35 is closed, it engages with the chamber and is electrically communicated therewith. Thus, it is grounded. With this structure, leakage of electromagnetic waves of a value inconvenient for the frequency range of 9 KHz to 400 GHz, from a semiconductor manufacturing apparatus, can be prevented. Also, with the structure that the mesh-like metal 40 is provided on a resin, an operator can observe the inside of the semiconductor manufacturing apparatus. This is very desirable in use.

While in the above-described example a mesh-like metal 40 is provided on the inside wall of the electromagnetic wave shielding plate 35, a similar advantageous result is attainable by providing a metal coating on the inside wall of the electromagnetic wave shielding plate 35 and on the surface which is contactable with the chamber. Further, the electromagnetic wave shielding plate 35 itself may be made of a material having a property of leaking electromagnetic waves of a quantity not greater than a limit.

With the structure described above, since the electromagnetic wave leakage preventing means is provided at the semiconductor manufacturing apparatus side, the electromagnetic wave leakage from the semiconductor manufacturing apparatus of an amount greater than a limit can be prevented effectively.

[Second Embodiment]

Figure 3:
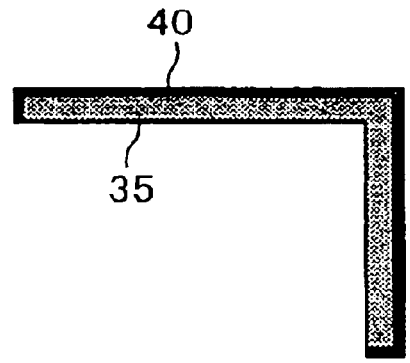
FIG. 3 is a sectional view of an electromagnetic wave shielding plate having a mesh-like metal provided at an outside wall thereof.

A second embodiment of the present invention will be described with reference to FIG. 3. Since this embodiment is similar to the first embodiment in many points, only distinctive features will be described.

A major difference between this embodiment and the first embodiment resides in that a mesh-like metal 40 is provided on an outside wall of an electromagnetic wave shielding plate 35. Here, the outside wall mesh-like metal 40 and the resin are made coplanar with each other, such that the metal is not protruded from the surface. Also, the mesh-like metal 40 extends to the surface of the electromagnetic wave shielding plate 35, which surface is contactable with the chamber. Thus, when the electromagnetic wave shielding plate 35 is closed, the metal mesh engages with the chamber and is electrically communicated therewith. Thus, it is grounded. With this structure, leakage of electromagnetic waves of a value inconvenient for the frequency range of 9 KHz to 400 GHz, from a semiconductor manufacturing apparatus, can be prevented.

While, in the above-described example, a mesh-like metal 40 is provided on the outside wall of the electromagnetic wave shielding plate 35, a similar advantageous result is attainable by providing a metal coating on the outside wall of the electromagnetic wave shielding plate 35 and on the surface which is contactable with the chamber. Further, the electromagnetic wave shielding plate 35 itself may be made of a material having a property of leaking electromagnetic waves of a quantity not greater than a limit.

With the structure described above, since the electromagnetic wave leakage preventing means is provided at the semiconductor manufacturing apparatus side, the electromagnetic wave leakage from the semiconductor manufacturing apparatus of an amount greater than a limit can be prevented effectively.

[Third Embodiment]

A third embodiment of the present invention will be described with reference to FIG. 6. In this embodiment, the electromagnetic wave leakage preventing function is provided in a case wherein a pod (SMIFPOD) 26 is to be loaded into a semiconductor manufacturing apparatus.

Figure 6:
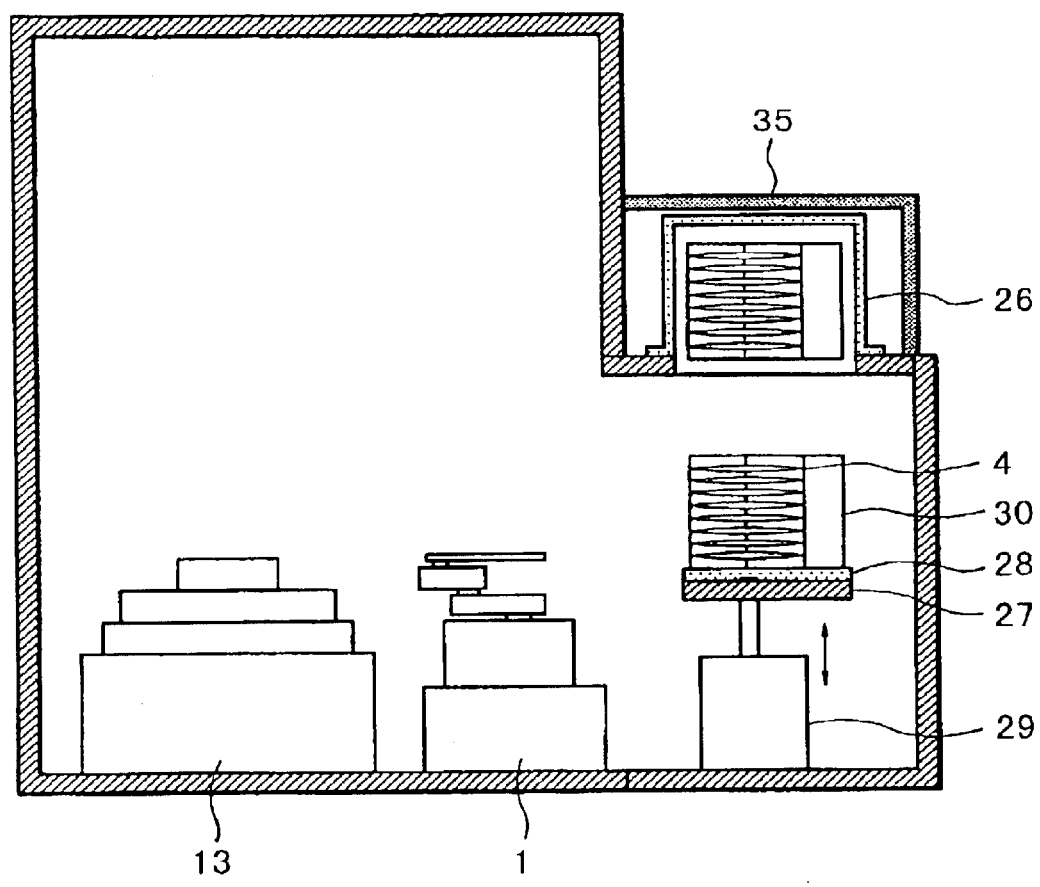
FIG. 6 is a schematic view of a third embodiment of the present invention.

As shown in FIG. 6, after an electromagnetic wave shielding plate 35 is opened by using an opening/closing mechanism (not shown), a pod (SMIFPOD) 26 is loaded into a semiconductor manufacturing apparatus through a PGV or an AGV.

Subsequently, the electromagnetic wave shielding plate 35 is closed by the unshown opening/closing mechanism, and then, a bottom SMIFPOD door 28 of the pod 26 is opened by releasing its lock (not shown) by using a door lock releasing mechanism (not shown) which is provided at a SMIFPOD opening/closing door 27.

Thereafter, while the door 28 of the pod is kept in intimate contact with the pod opening/closing door 27, it is moved downwardly by means of an indexer 29. As a result of this operation, a carrier 30 inside the pod 26 is placed into the semiconductor manufacturing apparatus, such that substrates 4 which are accommodated in the carrier 30 can be conveyed to the major assembly of the semiconductor manufacturing apparatus.

Here, if there is no electromagnetic wave shielding plate 35, since the container of the pod 26 serves as a portion of an outside wall of the semiconductor manufacturing apparatus, unless the container itself is provided with a function for electromagnetic wave leakage prevention, there occurs continuous leakage of electromagnetic waves during the operation of the semiconductor manufacturing apparatus. In this embodiment, even if the pod 26 is not equipped with an electromagnetic wave leakage preventing function, leakage of electromagnetic waves from the container of the pod 26 can be suppressed by the electromagnetic wave shielding plate 35, to a level not greater than a predetermined value.

Thereafter, a substrate 4 is conveyed onto a wafer chuck 12 mounted on the processing station 13, by means of the conveyance robot 1. Then, the substrate is exposed through an optical system (not shown), and again it is conveyed by the conveyance robot 1 and is collected into the carrier 30.

The electromagnetic wave shielding plate 35 of this embodiment will be described in detail, with reference to FIGS. 2 and 3. Like those of the first and second embodiments, the electromagnetic wave shielding plate 35 is made of a resin. There is a mesh-like metal 40 which is formed on the inside wall face or outside wall face of the electromagnetic wave shielding plate 35, at a predetermined pitch. Also, the mesh-like metal 40 extends to the surface of the electromagnetic wave shielding plage 35, which surface is contactable with the chamber. Thus, when the electromagnetic wave shielding plate 35 is closed, it engages with the chamber and is electrically communicated therewith. Thus, it is grounded. With this structure, leakage of electromagnetic waves of a value inconvenient for the frequency range of 9 KHz to 400 GHz, from a semiconductor manufacturing apparatus, can be prevented.

While in the above-described example a mesh-like metal 40 is provided on the inside or outside wall of the electromagnetic wave shielding plate 35, a similar advantageous result is attainable by providing a metal coating on the inside or outside wall of the electromagnetic wave shielding plate 35 and on the surface which is contactable with the chamber. Further, the electromagnetic wave shielding plate 35 itself may be made of a material having a property of leaking electromagnetic waves of a quantity not greater than a limit.

With the structure described above, since the electromagnetic wave leakage preventing means is provided at the semiconductor manufacturing apparatus side, the electromagnetic wave leakage from the semiconductor manufacturing apparatus of an amount greater than a limit can be prevented effectively.

[Fourth Embodiment]

Figure 7:
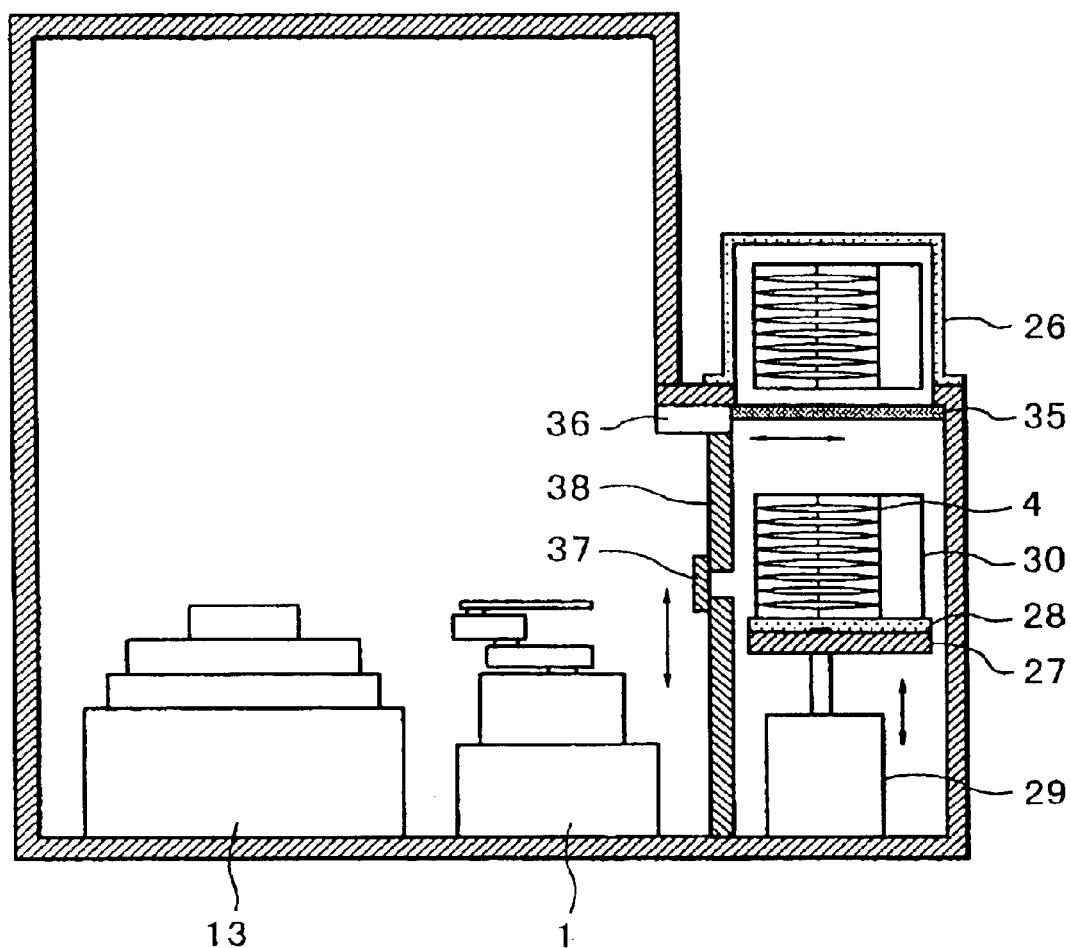
FIG. 7 is a schematic view of a fourth embodiment of the present invention.
Figure 8:
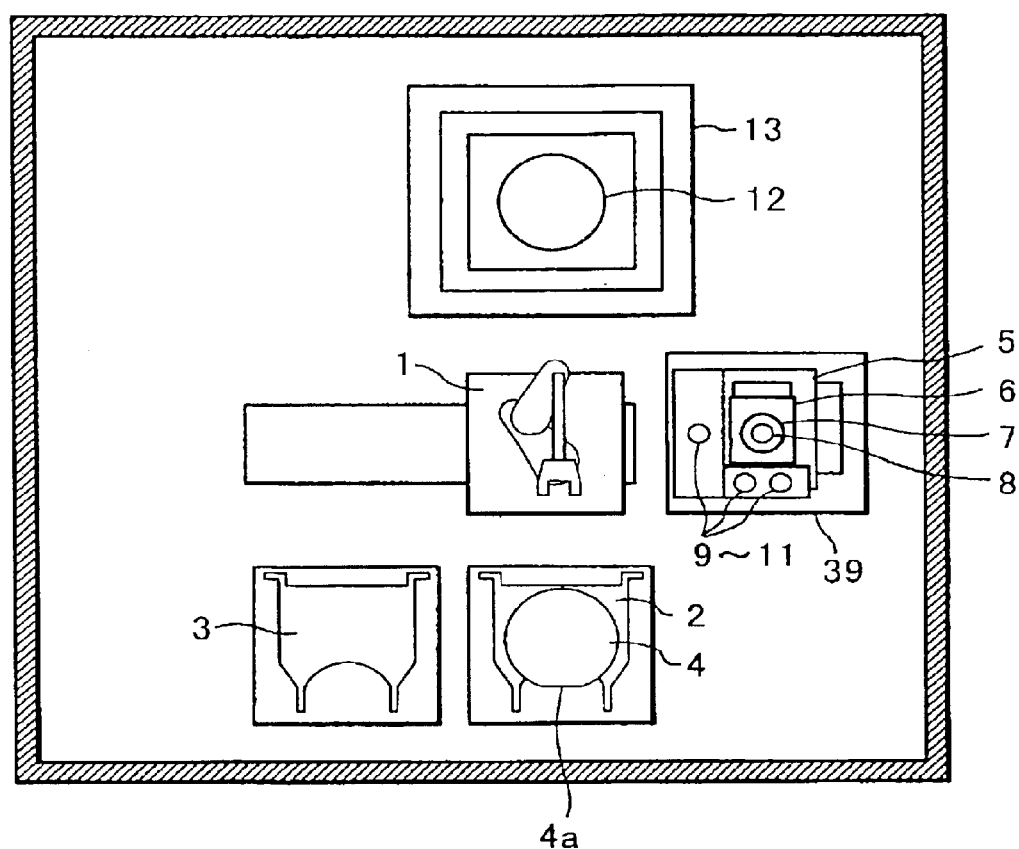
FIG. 8 is a schematic view of a conventional semiconductor manufacturing apparatus.

A fourth embodiment of the present invention will be described with reference to FIG. 7.

First, as an initial stage, with the provision of a second electromagnetic wave shielding plate 38 and a slit 37, there is no leakage of electromagnetic waves from a conveyance robot 1 side to an indexer 29 side.

Subsequently, the electromagnetic wave shielding plate 35 is opened by means of an electromagnetic wave shielding plate opening/closing mechanism 36 and, in this state, a bottom SMIFPOD door 28 of a pod (SMIFPOD) 26 is opened by releasing its lock (not shown) through a door lock releasing mechanism (not shown) which is provided at a SMIFPOD opening/closing door 27.

Thereafter, while the door 28 of the SMIFPOD pod is kept in intimate contact with the pod opening/closing door 27, it is moved downwardly by means of an indexer 29. As a result of this operation, a carrier 30 inside the pod 26 is placed into the semiconductor manufacturing apparatus, such that substrates 4 which are accommodated in the carrier 30 can be conveyed to the major assembly of the semiconductor manufacturing apparatus.

Further, after this, through the electromagnetic wave shielding plate opening/closing mechanism 36, the opening at the bottom of the pod 26 is closed by the electromagnetic wave shielding plate 35. Here, the top surface of the electromagnetic wave shielding plate 35 is held in intimate contact with the opening side.

Here, if there is no electromagnetic wave shielding plate 35, since the container of the SMIFPOD pod 26 serves as a portion of an outside wall of the semiconductor manufacturing apparatus, unless the container itself is provided with a function for electromagnetic wave leakage prevention, there occurs continuous leakage of electromagnetic waves during the operation of the semiconductor manufacturing apparatus. In this embodiment, even if the pod 26 is not equipped with an electromagnetic wave leakage preventing function, leakage of electromagnetic waves from the container of the pod 26 can be suppressed by the electromagnetic wave shielding plate 35, to a level not greater than a predetermined value.

Subsequently, the slit 38 is opened by means of an opening/closing mechanism (not shown), such that substrates which are accommodated in the carrier 30 can be conveyed into the main assembly of the semiconductor manufacturing apparatus.

Thereafter, a substrate 4 is conveyed onto a wafer chuck 12 mounted on the processing station 13, by means of the conveyance robot 1. Then, the substrate is exposed through an optical system (not shown), and again it is conveyed by the conveyance robot 1 and is collected into the carrier 30.

After this, the slit 37 is closed by the unshown opening/closing mechanism. After the electromagnetic wave shielding plate 35 is opened by the electromagnetic wave shielding plate opening/closing mechanism 36, the carrier 30 is stored into the pod 26 by means of the indexer 29.

The electromagnetic wave shielding plate 35 of this embodiment will be described in detail, with reference to FIGS. 2 and 3. Like those of the first, second and third embodiments, the electromagnetic wave shielding plate 35 is made of a resin. There is a mesh-like metal 40 which is formed on the inside wall face or outside wall face of the electromagnetic wave shielding plate 35, at a predetermined pitch. Also, the mesh-like metal 40 extends to the surface of the electromagnetic wave shielding plate 35, which surface is contactable with the chamber. Thus, when the electromagnetic wave shielding plage 35 is closed, the mesh metal engages with the chamber and is electrically communicated therewith. Thus, it is grounded. With this structure, leakage of electromagnetic waves of a value inconvenient for the frequency range of 9 KHz to 400 GHz, from a semiconductor manufacturing apparatus, can be prevented.

While, in the above-described example, a mesh-like metal 40 is provided on the inside or outside wall of the electromagnetic wave shielding plate 35, a similar advantageous result is attainable by providing a metal coating on the inside or outside wall of the electromagnetic wave shielding plate 35 and on the surface which is contactable with the chamber. Further, the electromagnetic wave shielding plate 35 itself may be made of a material having a property of leaking electromagnetic waves of a quantity not greater than a limit.

With the structure described above, since the electromagnetic wave leakage preventing means is provided at the semiconductor manufacturing apparatus side, the electromagnetic wave leakage from the semiconductor manufacturing apparatus of an amount greater than a limit can be prevented effectively.

[Embodiment of Semiconductor Device Manufacture]

Next, an embodiment of a semiconductor device manufacturing method which uses a semiconductor manufacturing apparatus such as described above, will be explained.

Figure 9:
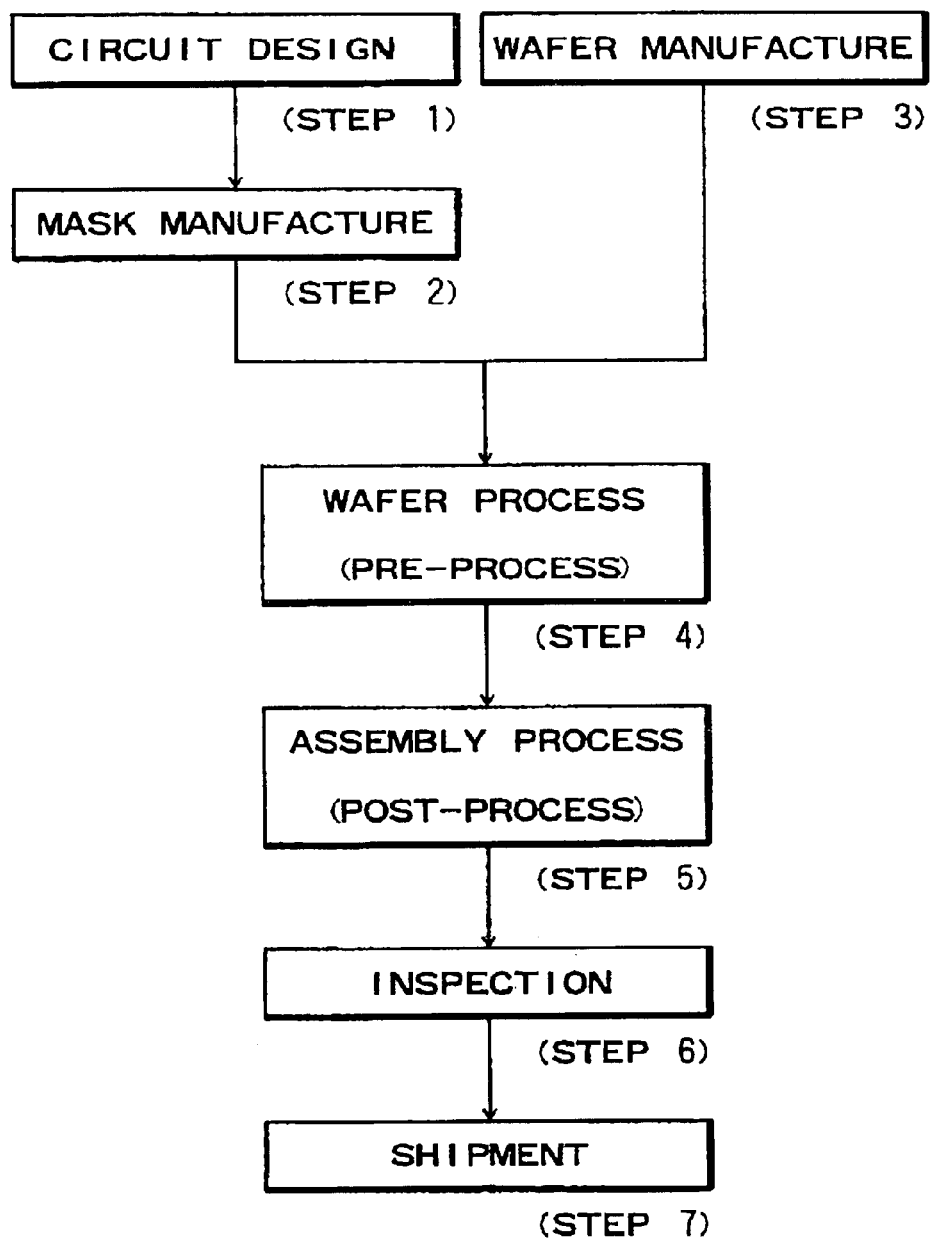
FIG. 9 is a flow chart of semiconductor device manufacturing processes.

FIG. 9 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 10:
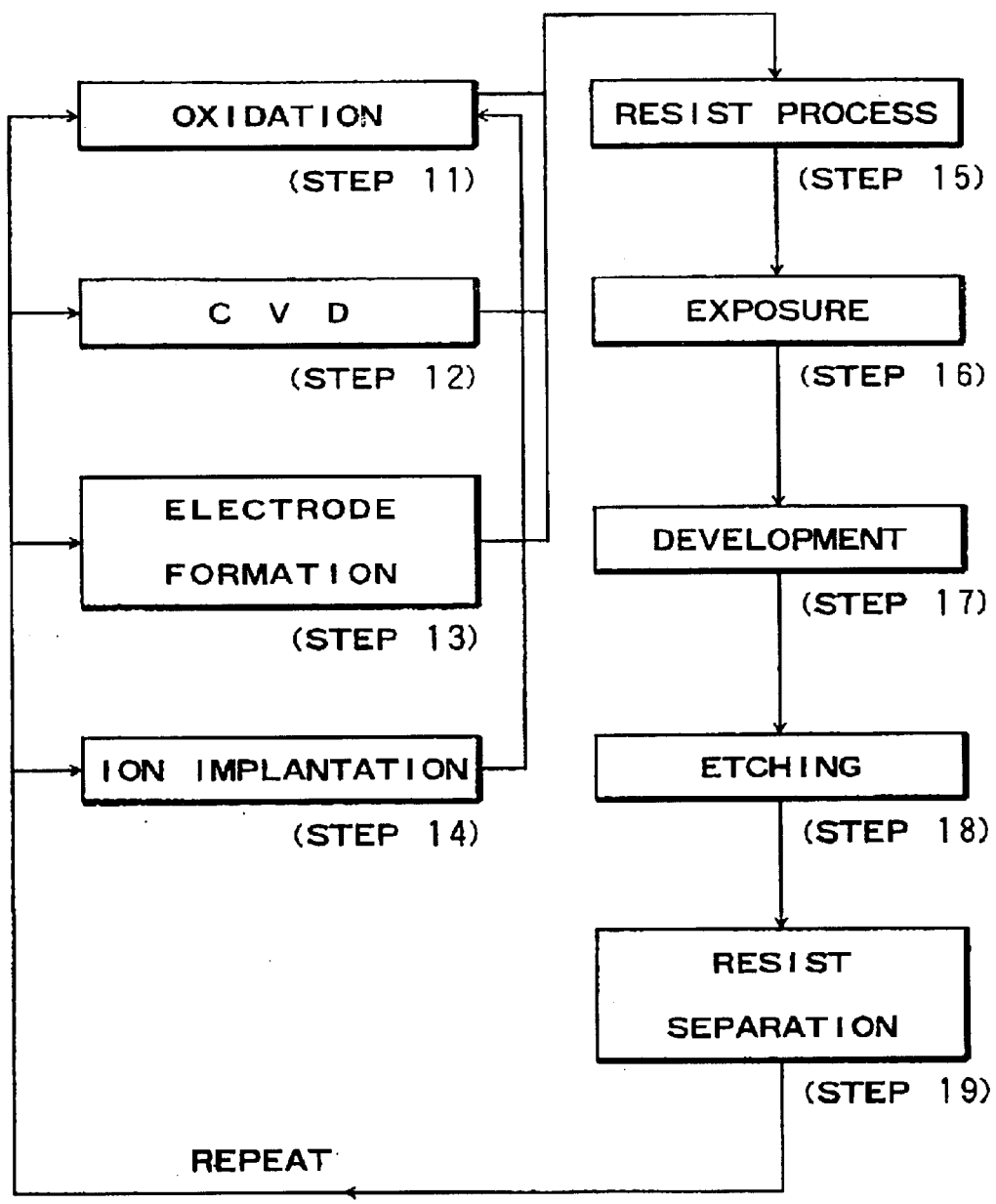
FIG. 10 is a flow chart for explaining details of a wafer process.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured effectively.

With the structure such as described hereinbefore, when a mini-environment type pod such as a FOUP or SMIFPOD is loaded into a semiconductor manufacturing apparatus, leakage of electromagnetic waves through an opening defined by the pod loading can be prevented effectively. Therefore, a semiconductor manufacturing apparatus can be maintained below a limit for an electromagnetic wave interference property (electromagnetic wave radiation interference).

While the invention has been described with reference to the structures disclosed herein, it is not confined to the details set forth and this application is intended to cover such modifications or changes as may come within the purposes of the improvements or the scope of the following claims.

What is claimed is:

1. A semiconductor manufacturing apparatus, comprising:
   leakage preventing means for preventing outward leakage of electromagnetic waves through an opening defined when a pod having a substrate accommodated therein is mounted on the semiconductor manufacturing apparatus, said leakage preventing means comprising at least one electromagnetic wave shielding plate and being provided at the semiconductor manufacturing apparatus side;
   a first electromagnetic wave shielding plate, which is openable and closable so that an opening defined when a carrier in the standard mechanical interface pod is moved downwardly is closed by said plate; and
   a second electromagnetic wave shielding plate in addition to the first electromagnetic wave shielding plate, said second electromagnetic wave shielding plate having an openable and closable slit and being provided between an indexer for moving the carrier in the standard mechanical interface pod downwardly and a conveyance robot for conveying the substrate.

2. An apparatus according to claim 1, wherein said at least one electromagnetic wave shielding plate is arranged to surround the pod as the pod is mounted.

3. An apparatus according to claim 1, further comprising an electromagnetic wave shielding member provided on one of (i) at least one of an inside wall face and an outside wall face of said electromagnetic wave shielding plate, and (ii) inside said electromagnetic wave shielding plate.

4. An apparatus according to claim 3, wherein said electromagnetic wave shielding member is provided at a surface of said electromagnetic wave shielding plate, which surface is engageable with a chamber for surrounding a main assembly of said semiconductor manufacturing apparatus when said electromagnetic wave shielding plate is closed.

5. An apparatus according to claim 4, wherein said electromagnetic wave shielding plate is grounded through the chamber.

6. An apparatus according to claim 3, wherein said electromagnetic wave shielding member comprises a metal mesh.

7. An apparatus according to claim 3, wherein said electromagnetic wave shielding member comprises a metal coating.

8. An apparatus according to claim 1, wherein said semiconductor manufacturing apparatus is an exposure apparatus.

9. An apparatus according to claim 1, wherein the pod is a mini-environment pod.

10. An apparatus according to claim 9, wherein the pod is one of a front-open unified type pod and a standard mechanical interface pod.

11. A semiconductor device manufacturing method, comprising:
    a process for producing a semiconductor device by use of a semiconductor manufacturing apparatus as recited in claim 1.

12. A pod mounting method, comprising:
    performing leakage prevention for preventing outward leakage of electromagnetic waves through an opening defined when a pod having a substrate accommodated therein is mounted on a semiconductor manufacturing apparatus, wherein the leakage prevention uses at least one electromagnetic wave shielding plate provided at the semiconductor manufacturing apparatus side and is accomplished at the semiconductor manufacturing apparatus side;
    providing a first electromagnetic wave shielding plate that is openable and closable so that an opening defined when a carrier in the standard mechanical interface pod is moved downwardly is closed by the plate; and
    providing a second electromagnetic wave shielding plate in addition to the first electromagnetic wave shielding plate, the second electromagnetic wave shielding plate having an openable and closable slit and being provided between an indexer for moving the carrier in the standard mechanical interface pod downwardly and a conveyance robot for conveying the substrate.

13. A method according to claim 12, wherein the pod is a mini-environment type pod.

14. A method according to claim 13, wherein the pod is one of a front-open unified type pod and a standard mechanical interface pod.

15. A method according to claim 12, wherein the at least one electromagnetic wave shielding plate is arranged to surround the pod as the pod is mounted.

16. A method according to claim 12, wherein the electromagnetic wave shielding plate is grounded through the chamber.

17. A method according to claim 12, further comprising providing an electromagnetic wave shielding member one of (i) on at least one of an inside wall face and an outside wall face of the electromagnetic wave shielding plate, and (ii) inside the electromagnetic wave shielding plate.

18. A method according to claim 17, wherein the electromagnetic wave shielding member is provided at a surface of the electromagnetic wave shielding plate, which surface is engageable with a chamber for surrounding a main assembly of the semiconductor manufacturing apparatus when the electromagnetic wave shielding plate is closed.

19. A method according to claim 17, wherein the electromagnetic wave shielding member comprises a metal mesh.

20. A method according to claim 17, wherein the electromagnetic wave shielding member comprises a metal coating.

21. A semiconductor manufacturing apparatus, comprising:

processing means for performing a predetermined process to a substrate;

a chamber for covering said processing means and being arranged to keep an inside thereof clean and to prevent electromagnetic waves from being leaked outwardly;

mounting means for mounting a mini-environment type pod; and an electromagnetic wave shielding plate for preventing electromagnetic waves from being leaked outwardly through an opening defined when a portion of said chamber is opened to allow conveyance of the substrate, accommodated in said mini-environment type pod, toward said processing means.

22. An apparatus according to claim 21, wherein said electromagnetic wave shielding plate is disposed to cover said mini-environment type pod, said apparatus further comprises an opening/closing mechanism for opening and closing said electromagnetic wave shielding plate, and said opening/closing mechanism is adapted to bring said electromagnetic wave shielding plate into an open state when said mini-environment type pod is set to said mounting means and also is adapted to bring said electromagnetic wave shielding plate into a closed state when the portion of said chamber is opened.

23. An apparatus according to claim 21, wherein said electromagnetic wave shielding plate is in surface-contact to said chamber and is communicated with said chamber.

24. An apparatus according to claim 21, wherein said mini-environment type pod is one of a front-open unified type pod and a standard mechanical interface pod.

25. A semiconductor device manufacturing method, comprising:

a process for producing a semiconductor device by use of a semiconductor manufacturing apparatus as recited in claim 21.

26. A device manufacturing apparatus comprising:

a processing unit which processes a substrate;

a first chamber which covers said processing unit, has a first door through which the substrate is conveyed, and is arranged to prevent electromagnetic waves from leaking from said first chamber if the first door is closed;

a mounting unit which mounts at least a portion of a pod for accommodating the substrate, and is placed outside said first chamber; and a second chamber which is placed on said first chamber, covers said mounting unit, has a second door through which at least the portion of the pod is conveyed, and is arranged to prevent electromagnetic waves from leaking from said apparatus if the second door is closed.

27. An apparatus according to claim 26, wherein said second chamber is arranged to be grounded through said first chamber.

28. An apparatus according to claim 26, wherein said device manufacturing apparatus is an exposure apparatus.

29. An apparatus according to claim 26, wherein the pod is a mini-environment pod.

30. An apparatus according to claim 29, wherein the mini-environment pod is one of a front-open unified type pod and a standard mechanical interface pod.

31. A device manufacturing method comprising:

a step of processing a substrate using a device manufacturing apparatus according to claim 26.

* * * * *